(12) United States Patent
Koch

(10) Patent No.: US 7,683,708 B2
(45) Date of Patent: Mar. 23, 2010

(54) DIGITAL AMPLIFIER WITH ANALOGUE ERROR CORRECTION CIRCUIT

(75) Inventor: Rudolf Koch, Oberhaching (DE)

(73) Assignee: Infineon Technologies AG, Neubiberg (DE)

( * ) Notice: Subject to any disclaimer, the term of this patent is extended or adjusted under 35 U.S.C. 154(b) by 15 days.

(21) Appl. No.: 12/058,596

(22) Filed: Mar. 28, 2008

(65) Prior Publication Data

US 2008/0238543 A1 Oct. 2, 2008

(51) Int. Cl.
*H03F 3/38* (2006.01)
(52) U.S. Cl. .................. 330/10; 330/251; 330/207 A
(58) Field of Classification Search ............... 330/10, 330/251, 207 A See application file for complete search history.

(56) References Cited

U.S. PATENT DOCUMENTS 7,312,654 B2 * 12/2007 Roeckner et al. .............. 330/10

* cited by examiner

*Primary Examiner*—Patricia Nguyen
(74) *Attorney, Agent, or Firm*—Lee & Hayes, PLLC

(57) ABSTRACT

Digital amplifier for amplifying a digital input signal, comprising a digital modulator for converting the digital input signal into an amplitude-discrete and temporally analogue signal, comprising an analogue error correction circuit which modulates the pulse widths of the amplitude-discrete and temporally analogue signal in dependence on an analogue error signal, comprising a power switching stage, the input of which receives the signal modulated by the error correction circuit and which delivers the modulated signal amplified at an output and comprising an analogue feedback circuit which, in dependence on the output signal of the digital modulator and on the output signal of the power switching stage, generates the analogue error signal for adjusting the analogue error correction circuit.

17 Claims, 8 Drawing Sheets

DIGITAL AMPLIFIER WITH ANALOGUE ERROR CORRECTION CIRCUIT

The invention relates to a digital amplifier with analogue error correction circuit and to a method for amplifying a digital input signal In amplifiers, a distinction is made between different operating modes depending on the position of the operating point on the characteristic, namely amplifiers in class A mode, in class B mode, in class AB mode and in class C mode. In the case of class A amplifiers, the operating point is located approximately in the centre of the straight part of a transistor characteristic, wherein a current flows continuously, the instantaneous current intensity of which is linearly dependent on the instantaneous value of an input voltage. An amplifier operating in class B mode is a push-pull amplifier in which only a low current flows in the quiescent state. In this arrangement, a half wave of the alternating input voltage in each case drives one of the active components of the push-pull amplifier. In class AB mode, the operating point is located between that of the class A amplifier and that of the class B amplifier. When an amplifier is operating in class C, the operating point is located in the off-state region of the characteristic. Although the power losses are lower in class C mode than in class A or class B mode, amplifiers operating in class C mode have high distortions. Class A amplifiers, the operating points of which are located in the centre of the linear part of the transistor characteristic have a high static current which is not dependent on the drive, and thus have a low efficiency. The static current of push-pull class B amplifiers is lower than that of single-ended class A amplifiers and an efficiency of 78% can be achieved.

In the case of a class D amplifier, two transistors operated in push-pull are switched to and fro between two points of a characteristic intersecting the load hyperboles due to a signal pulse having a high pulse frequency. The transistors operate as switching transistors. During the signal pulse, the pulse duration or the pulse density or its mean value is proportional to the amplitude of the signal to be amplified, the frequency of which is lower than the pulse frequency. At the signal output of the class D amplifier, a low-pass filter is provided which filters the high-frequency components generated by the signal pulses out again. The power loss of a class D amplifier is even lower than that of a class C amplifier. Under certain conditions with respect to the upper cut-off frequency, thyristors can also be used instead of transistors. Class D amplifiers have a very high efficiency.

FIG. 1 shows the basic circuit configuration of a class D amplifier according to the prior art. An input signal coming from a signal source is converted by a modulator into an intermediate signal which has constant amplitudes in each time interval and is formed, for example, by a pulse-width modulated PWM signal or a pulse-density modulated PDM signal. To increase the efficiency and to minimize electromagnetic incompatibilities, the intermediate signal has a switching rate which is as low as possible. The switch stage following the modulator amplifies the signal pulses of the received intermediate signal and delivers the amplified signal pulses to a following filter. The filter is a loss-free low-pass filter which filters out the higher-frequency components caused by the pulses. The output signal is delivered to any type of load, for example to a loudspeaker.

FIG. 2 shows an example of a class-D amplifier according to the prior art for operating a loudspeaker. A comparator is used as modulator and compares an analogue input signal with a triangular reference signal for generating a pulse-width modulated intermediate signal. The pulse-width modulated intermediate signal is supplied to a switching stage which contains two MOSFET transistors M1, M2 of complementary configuration. The gate terminals of the two MOSFETs M1, M2 are connected to the output of the comparator. In addition, the two MOSFET transistors have a common drain connection to which the output low-pass filter is connected. The two MOSFET transistors are operated as switches. The low-pass filter is formed by the inductance L1 and the capacitor C1 and the switching network which consists of the resistor R1 and the capacitor C2 compensates for the inductive impedance of the loudspeaker coil so that the low-pass filter sees a real resistance load at high frequencies.

FIG. 3 shows the generation of the pulse-width modulated intermediate signal in dependence on the analogue input signal $V_S$ by means of the triangular reference signal $V_T$. In the example shown, the input signal $V_S$ is a sinusoidal input signal.

Apart from higher efficiency, digital amplifiers are simpler to integrate or simple to miniaturize, respectively, in new technologies.

The input signals for class D amplifiers can be present in analogue form and in digital form. Since the transistors provided in the switching stage of class D amplifiers are completely switched through, the full supply voltage is available for the load, i.e. an efficiency of $\eta=100\%$ can be achieved in theory.

FIG. 4A shows the switching characteristic for a class D amplifier with a two-level binary output signal and FIG. 4B shows the switching characteristic of a differential class D amplifier for a ternary three-level output signal. As can be seen from the characteristic in FIG. 4A, two-level class D amplifiers operate inherently linearly. With suitable implementation, three-level class D amplifiers can have a very good linearity.

However, a real switching output stage as is shown, for example, in FIG. 2, generates signal disturbances which are superimposed on the output signal. These signal disturbances are mainly caused by the non-ideal switching character of the transistors. The two transistors can have different on- and off-times and different rise and decay times which lead to distortion in the analogue output signal. Further causes of disturbance are, for example, non-ideal matching between the transistors and temperature deviations between the transistors.

A further cause for the distortion of the output signal are supply voltage fluctuations at the switching stage. Considerable supply voltage fluctuations can occur particularly in mobile devices which are supplied with voltage by batteries or accumulators. For example, mobile telephones have a supply voltage from 3 to 5 volts and supply voltage dips of up to ½ volt can occur.

In many applications, a digital input signal is present in the form of digital data. Particularly in the field of mobile radio, data words comprising, for example, 2 bytes, must be amplified.

A conventional possibility of error correction in a digital amplifier which receives a digital input signal consists in feeding the output signal of the class D amplifier back to the input through an analogue/digital converter as is shown by way of example in FIG. 5. In this arrangement, the resolution of the analogue/digital converter must correspond at least to the required resolution of the digital amplifier. The signal fed back is subtracted from a digital input signal by a subtractor. However, the arrangement shown in FIG. 5 is only very complex to implement as a circuit since a high-resolution analogue/digital converter and a digital modulator are needed.

FIG. 6 shows a digital amplifier according to the prior art which is described in DE 196 19 208 A1. The digital amplifier described there performs an error correction in accordance with the sigma/delta principle. The received digital input signal is converted into a binary 1-bit sigma/delta modulated signal by a digital sigma/delta D/A modulator and then supplied to a subtractor which subtracts a signal fed back from the sigma/delta modulated signal present. The difference signal is supplied via a forward signal path which comprises a loop filter, a comparator and a switching output stage. The loop filter is an SC (switched capacitor) loop filter which is clocked with a clock signal. The clock frequency of the SC loop filter is typically as high as the clock frequency of the comparator following. The signal amplified by the switching output stage is filtered by an anti-aliasing filter and fed back to the subtractor as feedback signal. A disadvantage of the circuit arrangement according to the prior art shown in FIG. 6 consists in that the loop filter is a switched-capacitor filter clocked with a very high switching frequency and can thus cause disturbances.

A further disadvantage of the circuit arrangement shown in FIG. 6 consists in that fluctuations of the supply voltage VDD for the switching output stage are not compensated for. Especially in mobile devices such as mobile radio telephones which are supplied with voltage by batteries or accumulators, considerable supply voltage fluctuations can occur in operation which lead to disturbances or distortions of the output signal of the class D amplifier. The circuit according to the prior art shown in FIG. 6 cannot correct disturbances due to supply voltage fluctuations since it is not only the output signal but also the signal delivered by the digital sigma/delta D/A converter, which is used as reference signal, which has in the case of supply voltage fluctuations amplitude disturbances which are no longer compensated for by the feedback.

It is the object of the present invention, therefore, to create a digital amplifier for amplifying a digital input signal which is capable of correcting supply voltage fluctuations and which could be implemented with minimal expenditure.

According to the invention, this object is achieved by a digital amplifier having the features specified in Claim 1 and by a method having the features specified in Claim 17.

The invention creates a digital amplifier for amplifying a digital input signal comprising
   a digital modulator for converting the digital input signal into an amplitude-discrete and temporally analogue signal;
   an analogue error correction circuit which modulates the pulse widths of data pulses of the amplitude-discrete and temporally analogue signal in dependence on an analogue error signal,
   a power switching stage, the input of which receives the signal modulated by the error correction circuit and which delivers the modulated signal amplified at an output, and comprising an analogue feedback circuit which, in dependence on the output signal of the digital modulator and on the output signal of the power switching stage, generates the analogue error signal for adjusting the error correction circuit.

In a preferred embodiment, the amplitude-discrete and temporally analogue signal is a pulse-width modulated signal or a pulse-density modulated signal.

In a preferred embodiment, the amplitude-discrete signal is a binary 1-bit signal or a ternary 1.5-bit signal.

In a preferred embodiment of the digital amplifier according to the invention, the analogue feedback circuit is an analogue integrator circuit.

In a preferred embodiment, a reference switching stage is provided which receives the output signal of the modulator and generates from it a reference signal for the analogue feedback circuit.

In a preferred embodiment, the reference switching stage consists of at least one inverter stage.

The reference switching stage is preferably supplied here with a smoothed supply voltage.

In a preferred embodiment of the digital amplifier according to the invention, the analogue error correction circuit has delay elements which are adjustable by analogue means.

In a preferred embodiment, the output signal of the modulator is branched at a branching node of the analogue error correction circuit to form a first signal and to form a second signal, wherein the branched first signal is supplied to a delay element of the error correction circuit with an adjustable signal delay and the branched second signal is supplied to a second delay element of the error correction circuit with a permanently set signal delay.

In a preferred embodiment of the digital amplifier according to the invention, the error correction circuit has a flip flop which is driven by the signals delayed by the two delay elements for generating the modulated signal.

In a preferred embodiment, the signal output of the flip flop is directly connected to the input of the power switching stage.

In a preferred embodiment of the digital amplifier according to the invention, the delay elements of the analogue error correction circuit are formed by inverter stages having a capacitive load.

In a preferred embodiment of the digital amplifier according to the invention, the signal delay of the first delay element of the error correction circuit is adjusted by adjusting the capacitive load of the inverter stage.

In an alternative embodiment of the digital amplifier, the signal delay of the first delay element of the error correction circuit is adjusted by adjusting shunt currents of the inverter stage.

In a further embodiment of the digital amplifier according to the invention, the error correction circuit has a logic circuit which logically combines the signals delayed by the two delay elements for generating the modulated signal.

The logic circuit is preferably an EXOR logic.

In a preferred embodiment of the digital amplifier according to the invention, the digital input signal consists of an N-bit-wide PCM signal.

The invention also creates a method for amplifying the digital input signal, comprising the following steps:
   converting a digital input signal into an amplitude-discrete and temporally analogue signal;
   modulating the pulse widths of the amplitude-discrete and temporally analogue signal in dependence on an analogue error signal;
   amplifying the modulated signal; and
   generating the analogue error signal in dependence on the amplitude-discrete and temporally analogue signal and on the amplified signal.

In the further text, preferred embodiments of the digital amplifier according to the invention and of the method according to the invention are described with reference to the attached figures for explaining features essential to the invention.

Figure 1:
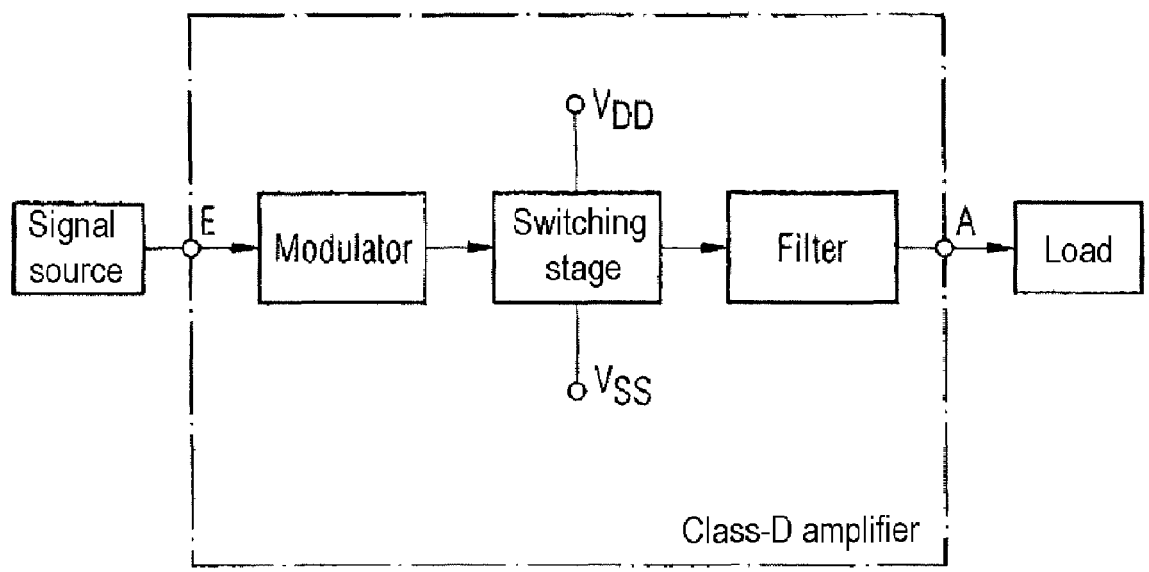
FIG. 1 shows a class D amplifier according to the prior art.
Figure 2:
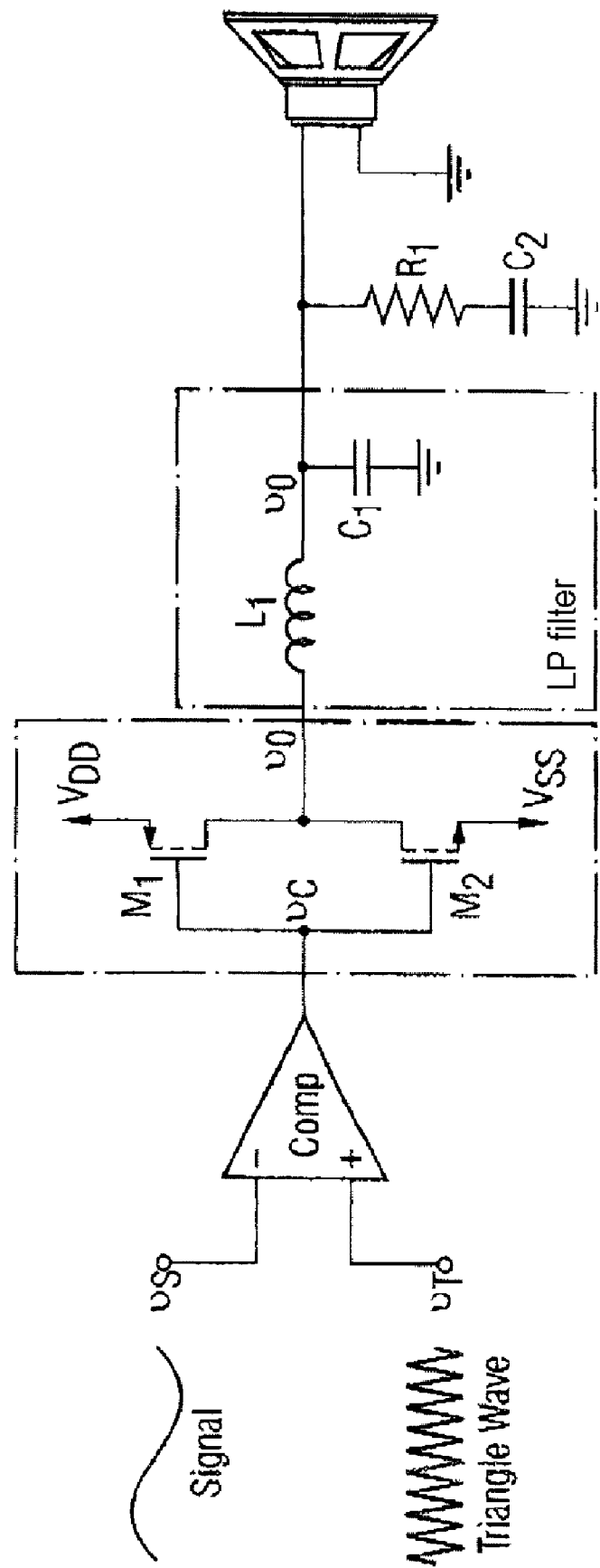
FIG. 2 shows a special embodiment for a class D amplifier according to the prior art.
Figure 3:
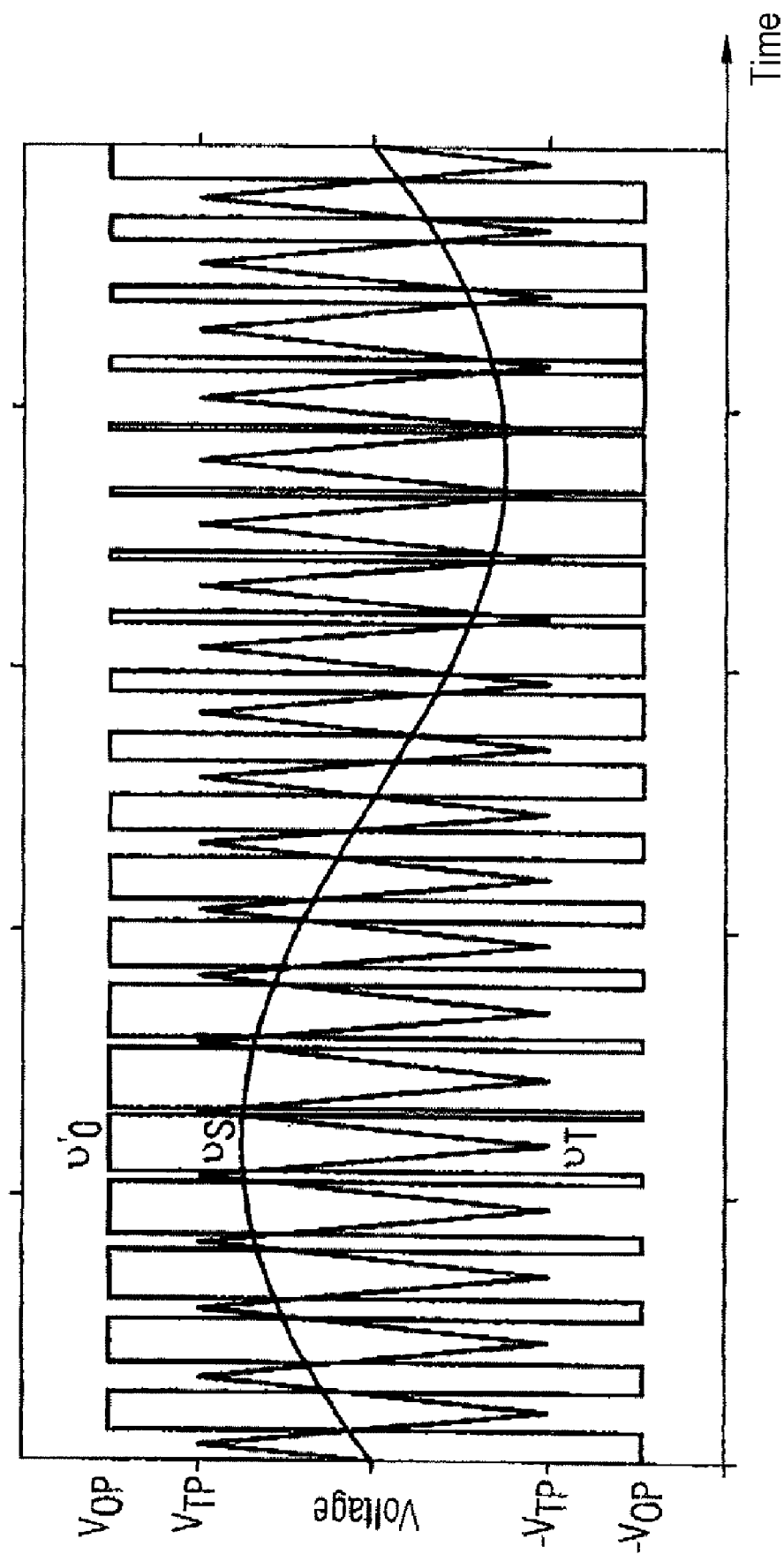
FIG. 3 shows a signal diagram for explaining the operation of a class D amplifier according to the prior art.
Figure 4A:
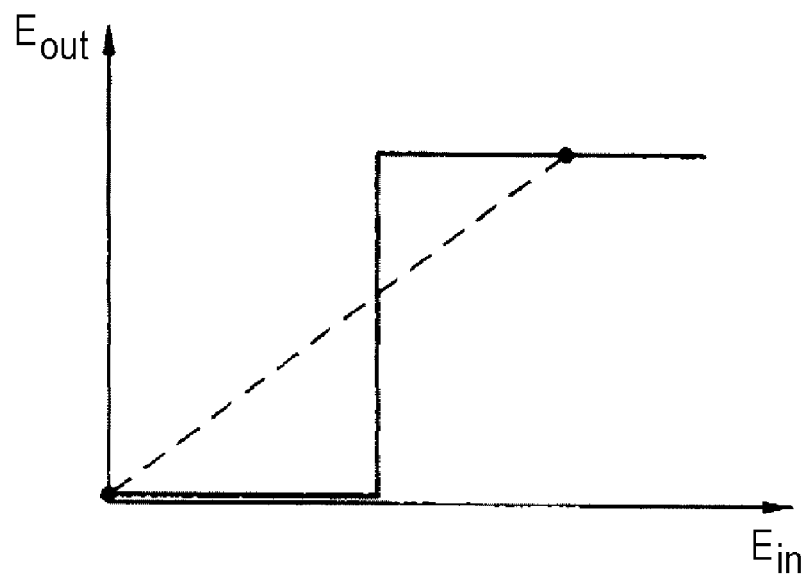
FIG. 4 shows switching characteristics of a class D amplifier according to the prior art.
Figure 4B:
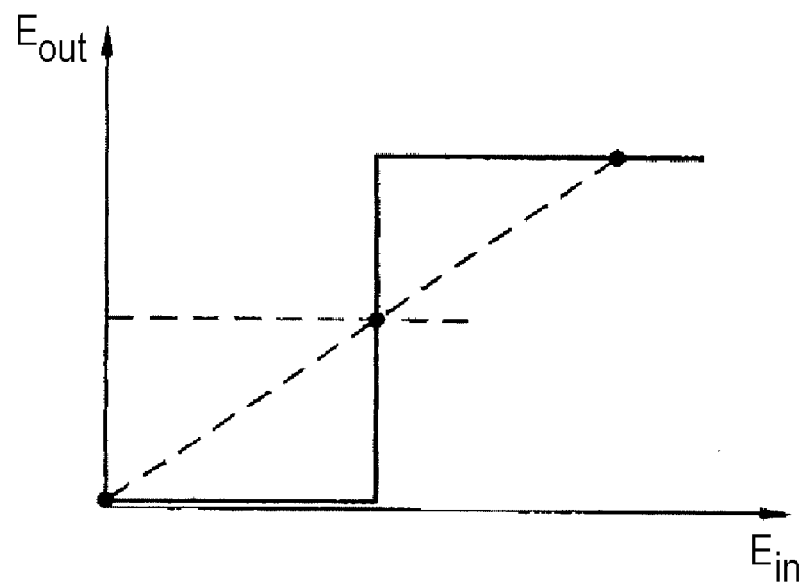
Figure 5:
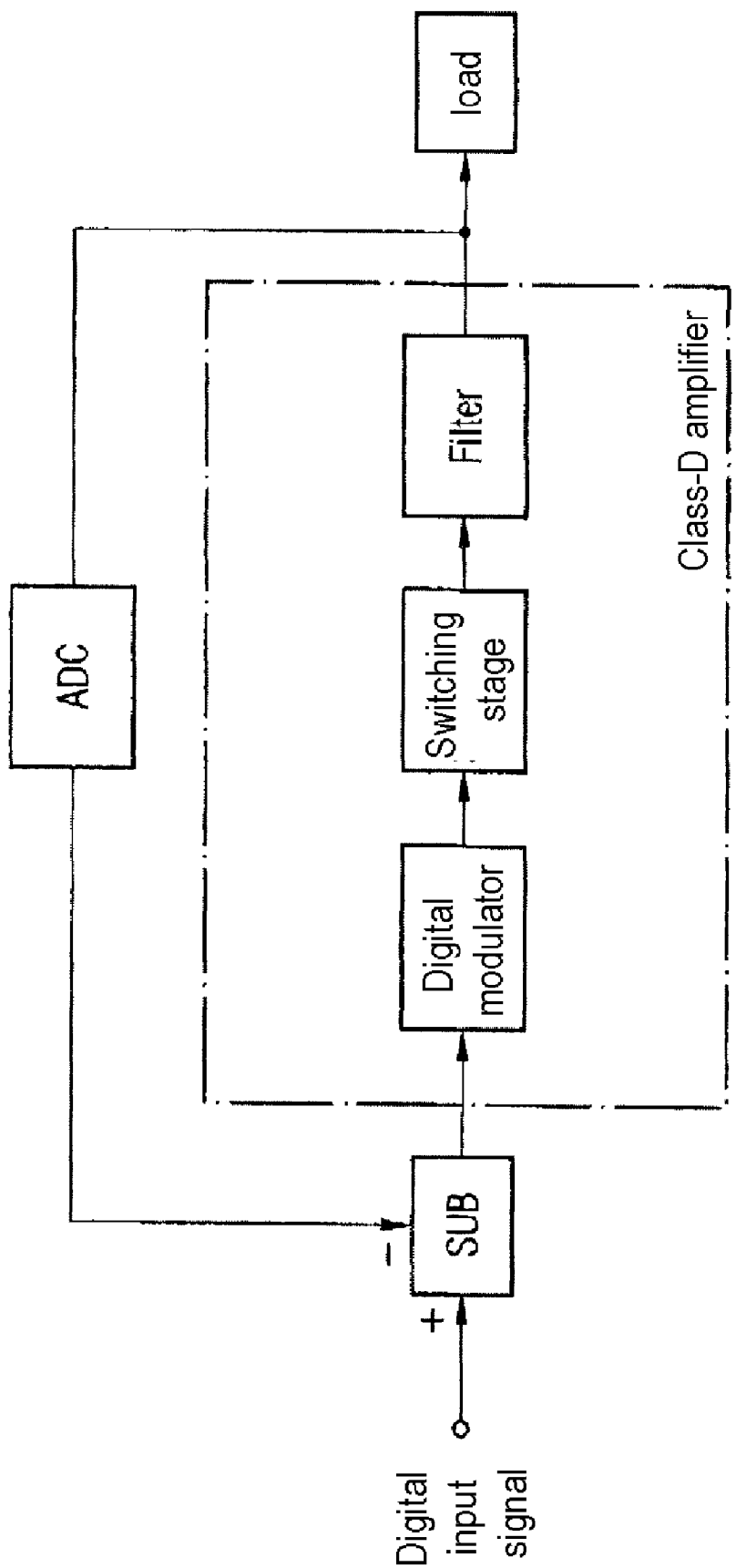
FIG. 5 shows a class D amplifier according to the prior art for amplifying a digital signal with digital feedback for error correction.
Figure 6:
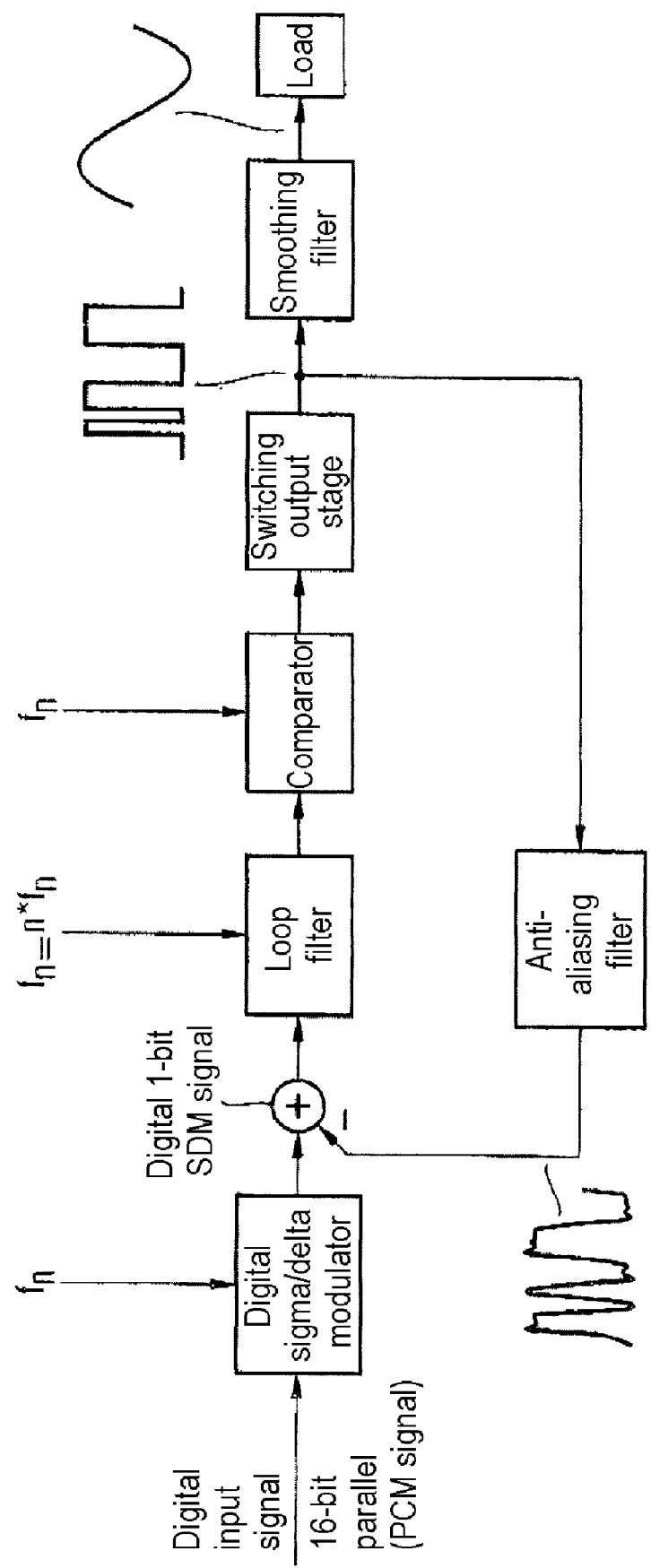
FIG. 6 shows a digital amplifier according to the prior art without supply voltage fluctuation compensation.
Figure 7:
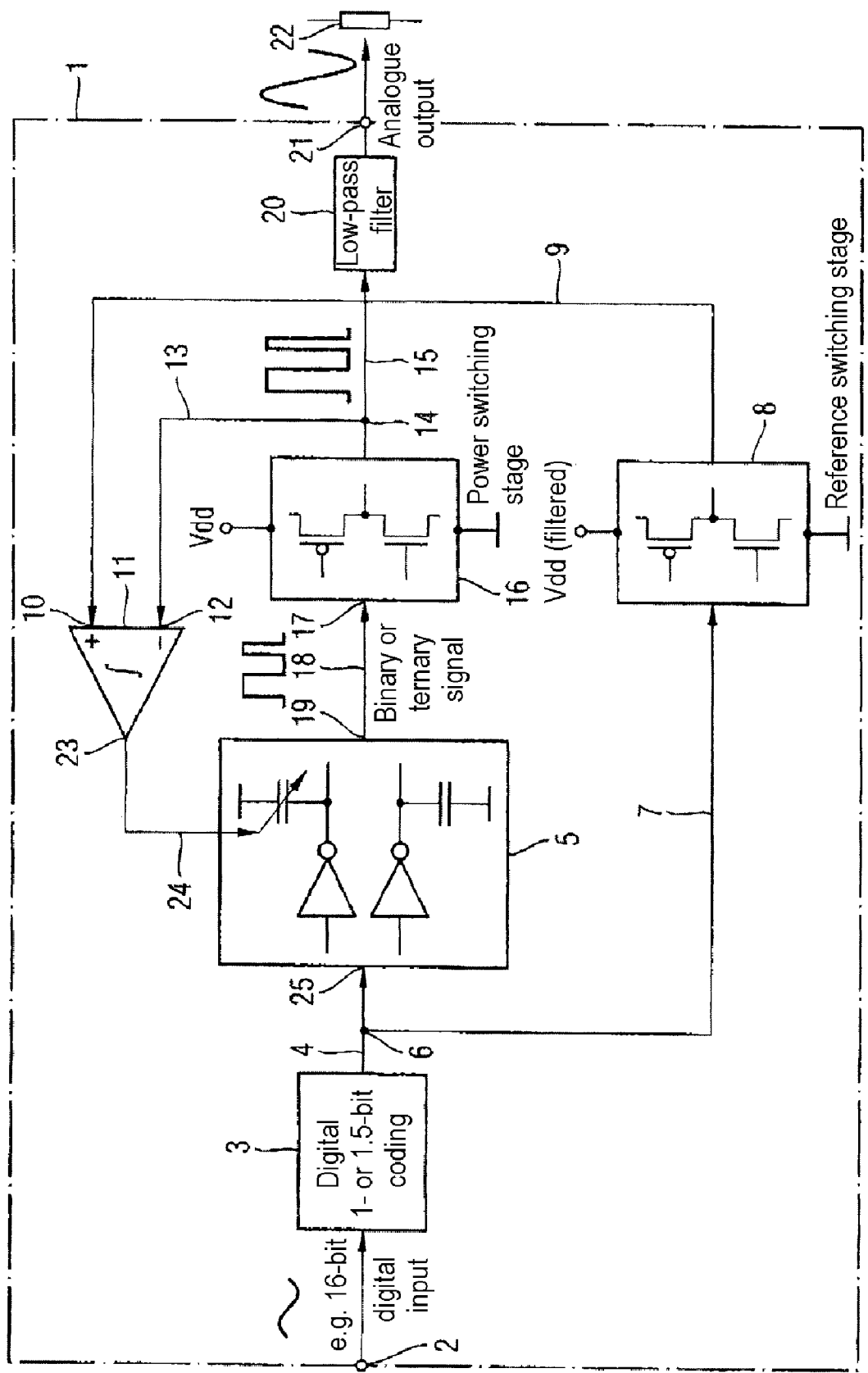
FIG. 7 shows a block diagram of a preferred embodiment of the digital amplifier according to the invention.

As can be seen from FIG. 7, a digital amplifier 1 according to the invention has a signal input 2 for receiving a digital input signal, for example an N-bit-wide PCM signal. The digital input signal is converted by a modulator 3 into an amplitude-discrete and temporally analogue signal. The output signal of the modulator 3 is binary or ternary. The output signal of the digital modulator 3 is supplied to an analogue error correction circuit 5 via a line 4. At a branching node 6, the output signal of the modulator 3 is also supplied to a reference switching stage 8 via a line 7. The modulator is, for example, a sigma/delta modulator.

In a preferred embodiment, the reference switching stage 8 consists of at least one inverter switching stage which contains two transistors in complementary configuration. In this arrangement, the reference switching stage 8 is supplied with voltage by a filtered supply voltage VDD. For this purpose, the supply voltage of the digital amplifier 1 is smoothed by means of an analogue filter or regulated by a regulating circuit. The reference signal delivered by the reference switching stage 8 is free of supply voltage fluctuations and is supplied to a first input 10 of an analogue feedback circuit 11 via a line 9.

The analogue feedback circuit 11 has a second signal input 12 which is connected via a line 13 at a node 14 to an output line 15 of a power switching stage 16. The power switching stage 16 has a signal input 17 for receiving a signal modulated by the error correction circuit 5. For this purpose, the signal input 17 of the power switching stage 16 is connected to a signal output 19 of the analogue error correction circuit 5 via an input line 18. The power switching stage 16 amplifies the binary- or ternary-coded signal modulated by the analogue error correction circuit 5. The amplified output signal is converted into an amplified analogue output signal by a following low-pass filter 20 and delivered to any type of load 22 at a signal output 21 of the digital amplifier 1.

The analogue feedback circuit 11 generates, in dependence on the output signal of the power switching stage 16 and in dependence on the reference signal delivered by the reference switching stage 8, an analogue error signal which is delivered to the analogue error correction circuit 5 at an output 23 via an adjustment control line 24. The analogue feedback circuit 11 is preferably an integrator circuit which integrates the deviation between the amplified useful signal and the reference signal for calculating a mean error. The integrator circuit is, for example, a correspondingly connected operational amplifier.

Figure 8:
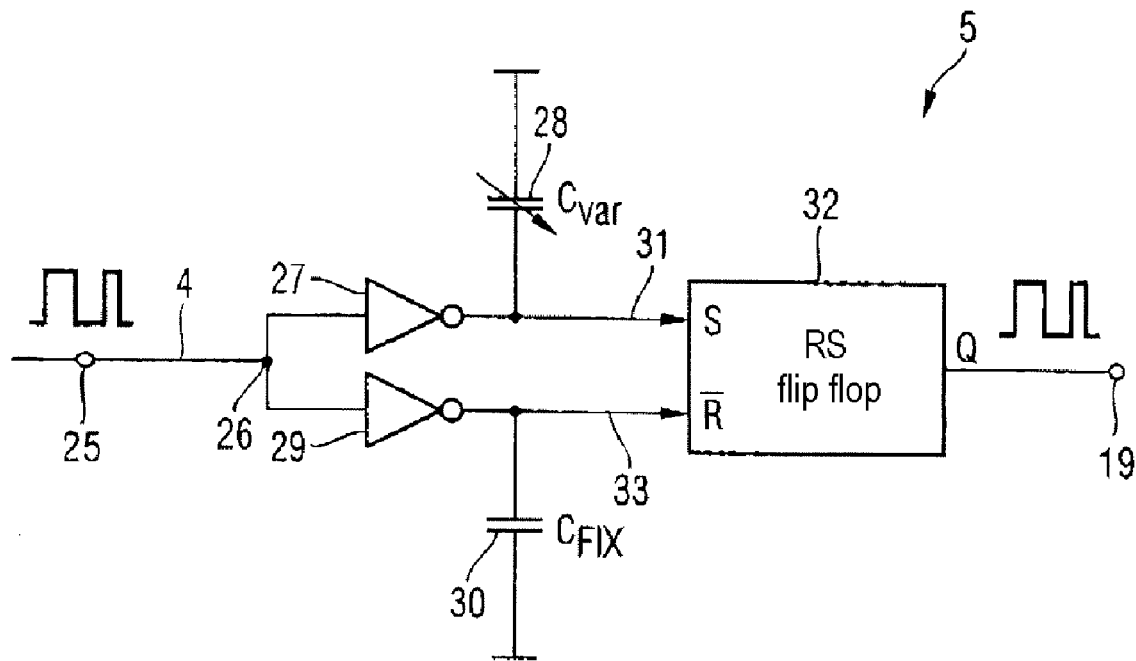
FIG. 8 shows an illustrative embodiment of an analogue error correction circuit contained in the digital amplifier according to the invention.

FIG. 8 shows an illustrative embodiment of the analogue error correction circuit 5 as shown in FIG. 7. The output signal of the digital sigma/delta modulator 3 received via the signal line 4 is received at a signal input 25 of the analogue error correction circuit 5 and supplied at a branching node 26 to a first delay element 27 with a variably adjustable capacitive load 28 and to a second delay element 29 with a constant capacitive load 30. The delay elements 27, 29 are preferably formed by inverter stages with a capacitive load. The first delay element 27 drives a set input S of an RS flip flop 32 via a line 31. The second delay element 29 drives a reset input $\overline{R}$ of the RS flip flop 32 via a line 33. The output of the RS flip flop 32 forms the signal output 19 of the error correction circuit 5.

Figure 9:
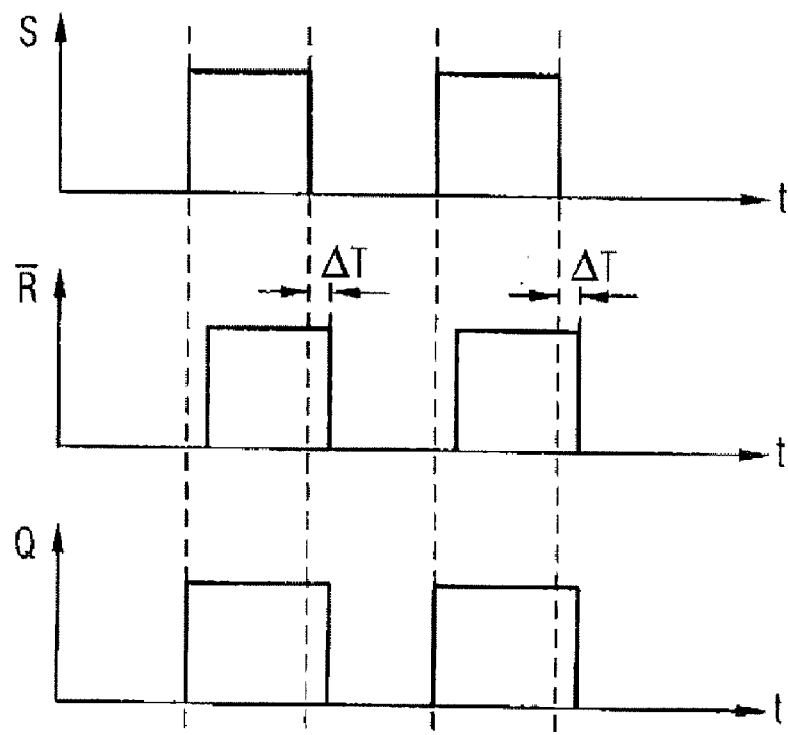
FIG. 9 shows a signal diagram for explaining the operation of the illustrative embodiment shown in FIG. 8.

FIG. 9 shows a signal diagram for explaining the operation of the analogue error correction circuit 5 shown in FIG. 8. The signal delay $\Delta T$ depends on the time constant of the first delay element 27 with variable capacitive load 28 and on the time constant of the second delay element 29 with constant capacitive load 30:

$$\Delta T = \tau_{VAR} - \tau_{FIX}.$$

The signal delay $\Delta T$ is much shorter than the duration T of one clock cycle of the modulator 3. As can be seen in FIG. 9, the pulse widths of the 1-bit-wide signal delivered by the digital modulator 3 are modulated in dependence on the signal delay $\Delta T$ set. The capacitance of the variable capacitor 28 is set in dependence on the error signal received from the analogue feedback circuit 11 via line 24. To modulate the pulse widths or pulse duration, it is sufficient to influence one of the two pulse edges. In an alternative embodiment, both pulse edges are modulated.

In an alternative embodiment, the analogue error correction circuit 5 has instead of the RS flip flop 33 a logic circuit which logically combines the signals delayed by the two delay elements for generating the modulated signal. This logic circuit is preferably an EXOR grate.

In an alternative embodiment, the signal delay of the delay elements is adjusted by adjusting shunt currents of the inverter stages. In the digital amplifier 1 according to the invention, a correction in the time domain occurs by modulating the pulse widths of the 1-bit- or 1.5-bit-wide output signal of the modulator 3. In the digital amplifier 1 according to the invention, an analogue feedback 11 of the error signal is provided independently of whether the signal is processed in accordance with the sigma/delta method or in accordance with a conventional pulse-width modulation method. In the digital amplifier 1 according to the invention, as shown in FIG. 7, the simple analogue feedback allows the use of an elaborate analogue/digital converter with high signal quality to be dispensed with. In addition, using the reference switching stage 8 also makes the digital amplifier 1 according to the invention insensitive to supply voltage fluctuations. The digital amplifier 1 according to the invention is distinguished by high signal quality and a large power supply rejection ratio.

LIST OF REFERENCE DESIGNATIONS

1 Digital amplifier
2 Digital signal input
3 Digital modulator
4 Line
5 Analogue error correction circuit
6 Branching node
7 Line
8 Reference switching stage
9 Line
10 Signal input
11 Feedback circuit
12 Signal input
13 Line
14 Branching node
15 Line
16 Power switching stage 17 Signal input
18 Line
19 Signal output
20 Low-pass filter
21 Output
22 Load
23 Signal output
24 Adjusting line
25 Signal input
26 Branching node
27 Inverter switching stage
28 Variable capacitive load
29 Inverter switching stage
30 Constant capacitive load
31 Control line
32 RS flip flop
33 Control line

The invention claimed is:

1. Digital amplifier for amplifying a digital input signal, comprising:
   a) a digital modulator for converting the digital input signal into an amplitude- discrete and temporally analogue signal;
   b) an error correction circuit which modulates the pulse widths of the amplitude-discrete and temporally analogue signal in dependence on an analogue error signal;
   c) a power switching stage, the input of which receives the signal modulated by the error correction circuit (5) and which delivers the modulated signal amplified on an output line; and comprising
   d) an analogue integrator circuit with a first signal input, at which a reference signal is present, and a second signal input which is connected to the output line of the power switching stage, wherein the integrator circuit integrates the deviation between the reference signal and the amplified signal present at the output line for calculating the analogue error signal, wherein a reference switching stage is provided which receives the output signal of the modulator and generates from this the reference signal for the analogue integrator circuit.

2. Digital amplifier according to claim 1, wherein the analogue integrator circuit has an operational amplifier.

3. Digital amplifier according to claim 1, wherein the reference switching stage has at least one inverter stage.

4. Digital amplifier according to claim 3, wherein the reference switching stage is supplied with a smoothed supply voltage.

5. Digital amplifier for amplifying a digital input signal, comprising:
   a) a digital modulator for converting the digital input signal into an amplitude-discrete and temporally analogue signal;
   b) an error correction circuit which modulates the pulse widths of the amplitude-discrete and temporally analogue signal in dependence on an analogue error signal, the error correction circuit having delay elements which are adjustable by analogue means;
   c) a power switching stage, the input of which receives the signal modulated by the error correction circuit (5) and which delivers the modulated signal amplified on an output line; and comprising
   d) an analogue integrator circuit with a first signal input, at which a reference signal is present, and a second signal input which is connected to the output line of the power switching stage, wherein the integrator circuit integrates the deviation between the reference signal and the amplified signal present at the output line for calculating the analogue error signal.

6. Digital amplifier according to claim 5, wherein the output signal of the modulator is branched at a branching node of the error correction circuit to form a first signal and to form a second signal, wherein the branched first signal is supplied to a first delay element of the error correction circuit with adjustable signal delay and the branched second signal is supplied to a second delay element of the error correction circuit with fixed signal delay.

7. Digital amplifier according to claim 6, wherein the error correction circuit has a flip flop which is driven by the signals delayed by the two delay elements for generating the modulated signal.

8. Digital amplifier according to claim 7, wherein a signal output of the flip flop is connected to the input of the power switching stage.

9. Digital amplifier according to claim 5, wherein the delay elements of the error correction circuit are formed by inverter stages having a capacitive load.

10. Digital amplifier according to claim 9, wherein the signal delay of the first delay element of the error correction circuit is adjusted by adjusting the capacitive load of the inverter stage.

11. Digital amplifier according to claim 9, wherein the signal delay of the first delay element of the error correction circuit is adjusted by adjusting shunt currents of the inverter stage.

12. Digital amplifier according to claim 6, wherein the error correction circuit has a logic circuit which logically combines the signals delayed by the two delay elements for generating the modulated signal.

13. Digital amplifier according to claim 12, wherein the logic circuit is formed by an EXOR logic.

14. Digital amplifier according to claim 1, wherein the digital input signal is an N-bit-wide PCM signal.

15. Digital amplifier according to claim 1, wherein the amplitude-discrete and temporally analogue signal is a pulse-width modulated signal or a pulse-density modulated signal.

16. Digital amplifier according to claim 1, wherein the amplitude-discrete signal is a binary 1-bit signal or a ternary 1.5-bit signal.

17. Method for amplifying a digital input signal, comprising the following steps:
   a) converting a digital input signal into an amplitude-discrete and temporally analogue signal;
   b) modulating the amplitude-discrete and temporally analogue signal in dependence on an analogue error signal;
   c) amplifying the modulated signal;
   d) integrating a deviation between a reference signal and the amplified signal for calculating the analogue error signal; and
   e) receiving the amplitude-discrete and temporally analogue signal by a reference switching stage and using the amplitude-discrete and temporally analogue signal to generate the reference signal.

* * * * *